(12) United States Patent
Henstra

(10) Patent No.: US 10,825,644 B1
(45) Date of Patent: Nov. 3, 2020

(54) CORRECTOR TRANSFER OPTICS FOR LORENTZ EM

(71) Applicant: FEI Company, Hillsboro, OR (US)

(72) Inventor: Alexander Henstra, Eindhoven (NL)

(73) Assignee: FEI Company, Hillsoro, OR (US)

( * ) Notice: Subject to any disclaimer, the term of this patent is extended or adjusted under 35 U.S.C. 154(b) by 0 days.

(21) Appl. No.: 16/522,415

(22) Filed: Jul. 25, 2019

(51) Int. Cl.
| | |
|---|---|
| *H01J 37/153* | (2006.01) |
| *H01J 37/28* | (2006.01) |
| *H01J 37/20* | (2006.01) |
| *H01J 37/141* | (2006.01) |
| *H01J 37/26* | (2006.01) |

(52) U.S. Cl.
CPC .......... *H01J 37/153* (2013.01); *H01J 37/141* (2013.01); *H01J 37/20* (2013.01); *H01J 37/266* (2013.01); *H01J 37/28* (2013.01); *H01J 2237/14* (2013.01); *H01J 2237/1534* (2013.01); *H01J 2237/262* (2013.01); *H01J 2237/2802* (2013.01)

(58) Field of Classification Search
None
See application file for complete search history.

(56) References Cited

U.S. PATENT DOCUMENTS

| | | | | |
|---|---|---|---|---|
| 2012/0012747 | A1* | 1/2012 | Lazar | H01J 37/28 250/307 |
| 2014/0346354 | A1* | 11/2014 | Verbeeck | H01J 37/263 250/307 |

OTHER PUBLICATIONS

Martin Linck, et al; Chromatic Aberration Correction for Atomic Resolution TEM Imaging from 20 to 80 kV; Physical Review Letters; Aug. 12, 2016; pp. 076101-1-5; PRL 117; American Physical Society.

* cited by examiner

*Primary Examiner* — Andrew Smyth

(57) ABSTRACT

Charged particle microscopes having an optimized performance across multiple modes of operation are disclosed herein. More specifically, the disclosure includes improved charged particle microscopes that increase and/or optimize the performance of the microscope in both a standard mode of operation and a Lorentz mode of operation. The charged particle microscopes include an extra transfer lens between a corrector and the traditional transfer lens which allows for the flexibility to optimize performance in both the standard mode of operation and the Lorentz mode of operation. For example, in a Lorentz mode of operation, improved charged particle microscope according to the present disclosure can be used to tune the $C_5$ aberration, while hardly affecting defocus and/or $C_S$ aberrations. Additionally, the inclusion of the extra transfer lens provides the charged particle microscopes disclosed herein with an extra degree of freedom with which to zero defocus and total $C_S$ and $C_5$.

15 Claims, 6 Drawing Sheets

CORRECTOR TRANSFER OPTICS FOR LORENTZ EM

BACKGROUND OF THE INVENTION

The magnification and resolution of microscopes need to be continuously improved in order to enable scientists and engineers continue to explore and develop technologies at an increasingly smaller level. To achieve this, microscope components are continuously improved to increase microscope performance (i.e., increase resolution, increase magnification, reduce aberrations, etc.). However, when microscopes are capable of operating in more than one mode of operation, a change in one microscope component may improve microscope performance in a first mode while reducing the performance of the microscope in a second, different mode. Accordingly, microscope developments that improve and/or allow for the optimization of the microscope's performance across multiple modes of operation are desired.

SUMMARY OF THE INVENTION

Charged particle microscopes having an optimized performance in both a standard mode of operation and a Lorentz mode of operation, according to the present disclosure include a charged particle source configured to emit a charged particle beam toward a sample, a sample holder configured to hold the sample, a corrector for correcting axial aberrations (and/or other aberrations, such as off-axial coma), a Lorentz lens located between the corrector and the sample holder, and an objective lens between the Lorentz lens and the sample holder. The charged particle microscope is characterized by the inclusion of a first transfer lens positioned between the corrector and the Lorentz lens, and a second transfer lens positioned between the corrector and the first transfer lens. The charged particle microscope is configured to switch between the first configuration in which it operates in the standard operating mode, and the second configuration in which it operates in the Lorentz mode.

Methods for operating such charged particle microscopes configured to operate in a standard operating mode when in a first configuration, and a Lorentz operating mode when in a second configuration, according to the present disclosure comprise causing a charged particle beam to be emitted toward a sample by a charged particle source, and using a corrector to correct for axial (and in some cases off-axial) aberrations. When the charged particle microscope is operating in the Lorentz-operating mode (Lorentz-STEM or Lorentz TEM), the method includes using a first transfer lens and a second transfer lens to optimally tune defocus, $C_s$ and $C_5$. Additionally, when the microscope is operating in the standard operating mode (STEM or TEM), the method includes focusing the charged particle beam with the second transfer lens located between corrector and first transfer lens such that the second transfer lens assists the first transfer lens in imaging the corrector exit plane at or near the objective lens to minimize combination aberration $C_5$ (axial 5th order spherical aberration).

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Figure 1:
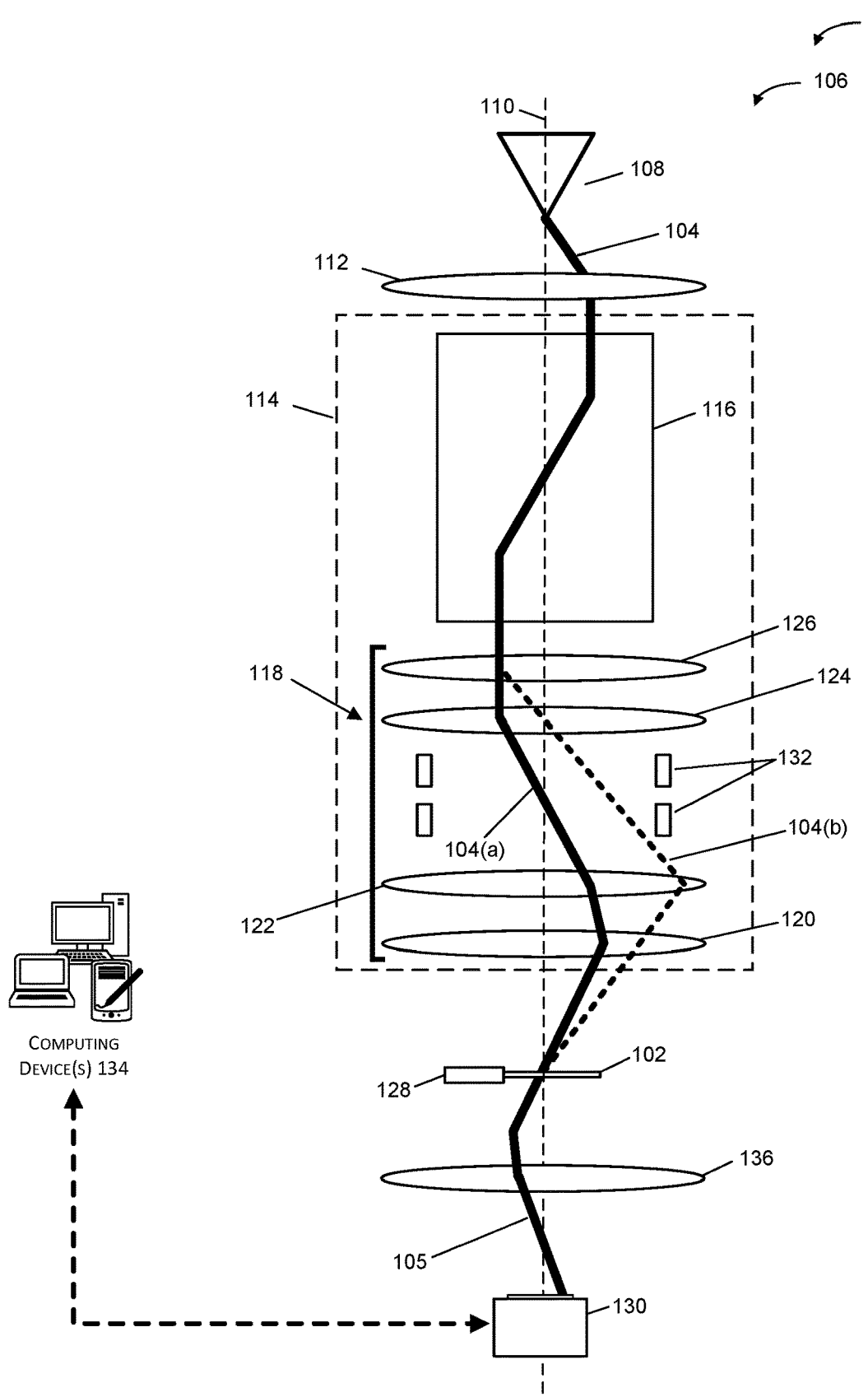
FIG. 1 illustrates example charged particle microscope systems for inspection of a sample having an optimized performance in multiple modes of operation.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Charged particle microscopes having an optimized performance across multiple modes of operation are disclosed herein. More specifically, the disclosure includes improved charged particle microscopes that increase and/or optimize the performance of the microscope in both a standard mode of operation and a Lorentz mode of operation. The charged particle microscopes include an extra transfer lens between a corrector and the traditional transfer lens which allows for the flexibility to optimize performance in both the standard mode of operation and the Lorentz mode of operation. For example, in a Lorentz mode of operation, the improved charged particle microscope according to the present disclosure can be used to tune the $C_5$ aberration with the first transfer lens, while hardly affecting defocus and/or $C_S$ aberrations. Additionally, the inclusion of the extra transfer lens provides the charged particle microscopes disclosed herein with an extra degree of freedom with which to zero defocus and total $C_S$ and $C_5$.

FIG. 1 is an illustration of example charged particle microscope system(s) 100 for inspection of a component of a sample 102 having an optimized performance in multiple modes of operation. The example charged particle microscope system(s) 100 may include electron microscope (EM) setups or electron lithography setups that are configured to irradiate and/or otherwise impinge the sample 102 with a beam of electrically charged particles 104 (usually an electron beam or an ion beam). In various embodiments the charged particle microscope system 100 may be or include one or more different types of EM and/or charged particle microscopes, such as, but not limited to, a scanning electron microscope (SEM), a scanning transmission electron microscope (STEM), a transmission electron microscope (TEM), a charged particle microscope (CPM), dual beam microscopy system, etc. Additionally, in some embodiments a TEM is capable of operating as a STEM as well.

FIG. 1 shows the example charged particle microscope system(s) 100 as being a STEM system 106 that is capable of operating in a standard mode of operation and a Lorentz mode of operation. A standard mode of operation corresponds to irradiation of the sample 102 with the charged particle beam 104 for the inspection of, deposition on, milling of, and/or extraction of a component of a sample 102. A Lorentz mode of operation corresponds to an imaging mode in which a magnetic contrast is generated base upon deflections experienced by the electrically charged particles 104 passing through a region of magnetic induction within the sample 102. As illustrated in FIG. 1, the path of the charged particle beam 104 changes depending on the mode of operation of the example charged particle microscope system(s) 100. For example, FIG. 1 shows the charged particle beam 104 following beam path 104(a) when the example charged particle microscope system(s) 100 is operating in standard operating mode, and beam path 104(b) when the example charged particle microscope system(s) 100 is operating in a Lorentz mode of operation. FIG. 1 further illustrates the path of the axial electrons 105 scattered by the sample 102 as a result of the electrically charged particles 104 being incident on the sample 102.

The example charged particle microscope system(s) 100 includes a charged particle source 108 (e.g., a thermal electron source, Schottky-emission source, field emission source, a liquid metal ion source, a plasma ion source, etc.) that emits the charged particle beam 104 along an emission axis 110 and towards an accelerator lens 112. The emission axis 110 is a central axis that runs along the length of the example charged particle microscope system(s) 100 from the charged particle source 108 and through the sample 102. For ease of understanding, the charged particle beam 104 is illustrated in FIGS. 1-3, 5, and 6 as a pencil beam. However, a person of skill in the art would understand that the pencil beam corresponds to the outer rays of the beam cone of the charged particle beam 104 (i.e., an outer diameter of the charged particle beam 104) as it passes through the example charged particle microscope system(s) 100. In other words, the beam 104 in FIG. 1 illustrates the axial rays of the charged particle beam.

The accelerator lens 112 accelerates/decelerates, focuses, and/or directs the charged particle beam 104 towards a focusing column 114. The focusing column 114 focuses the charged particle beam 104 so that it is incident on sample 102. Additionally, the focusing column 114 corrects and/or tunes aberrations (e.g., geometric aberrations, chromatic aberrations) of the charged particle beam 104. In FIG. 1, the focusing column 114 is illustrated as including a corrector 116 and an arrangement of a plurality of lenses 118. The corrector 116 is an optical component for correcting axial aberrations of the charged particle beam 104. In various embodiments, the corrector 116 may be a hexapole corrector, which can be a Rose(-like), a S-CORR corrector, or a Crewe(-like) hexapole corrector, or a quadrupole-octupole corrector, or any other type, or another type of corrector configured to correct geometric and/or chromatic aberrations within the example charged particle microscope system(s) 100. In the present disclosure, embodiments in which the charged particle beam 104 exits the corrector 116, the path of the charged particle beam is (substantially) parallel to the emission axis 110 are discussed. However, a person having skill in the art would understand that the disclosure can be extended to a non-parallel case (e.g., where the corrector 116 produces a beam cross-over at or near its exit plane).

In FIG. 1, the focusing column 114 is further illustrated as including the arrangement of a plurality of lenses 118 which include an objective lens 120, a Lorentz lens 122, a first transfer lens 124, and a second transfer lens 126. The objective lens 120 is an optical element that focuses the charged particle beam 104 to a point on the sample 102. The objective lens 120 may comprise a single-polepiece lens, a magnetic electrostatic compound lens, electrostatic detector objective lens, or another type of objective lens. In some embodiments, when the example charged particle microscope system 100 is operating in a Lorentz mode the objective lens 120 is turned off. In such embodiments, the Lorentz lens 122 acts like an objective lens and focuses the charged particle beam 104 onto the sample. The Lorentz lens 122 is an optical lens that renders a divergent portion of the charged particle beam 104 from the first transfer lens 124 so that it is a converging beam and/or less divergent beam. The Lorentz 122 acts as an additional transfer lens when the example charged particle microscope operates in a standard mode. For example, FIG. 1 illustrates the Lorentz lens 122 as rendering the divergent portion of charged particle beam 104 to (a) a less divergent beam when the example charged particle microscope system 100 operated in a standard mode of operation, and (b) a convergent beam when the example charged particle microscope system 100 operates in a Lorentz mode.

FIG. 1 further illustrates the arrangement of a plurality of lenses 118 as including multiple transfer lenses. Specifically, FIG. 1 illustrates the arrangement of a plurality of lenses 118 as including a first transfer lens 124 and a second transfer lens 126. Traditionally, similar microscope systems only contained a single transfer lens that was positioned and/or otherwise had its optical characteristics configured to optimize the performance of the microscope system during a single mode of operation. While such single transfer lens arrangements can be designed to have favorable performance in Lorentz mode, such configurations compromise the performance of the system when operating in a standard mode of operation.

More specifically, while present configurations of correctors and/or monochromators are capable of reducing energy spread, suppressing chromatic aberration, and correcting geometric aberrations up to order 5, the position of the single transfer lens in such current configurations is only optimal for standard modes of operation. That is, current single transfer lens configurations compromise performance in Lorentz modes of operation and/or are otherwise non-optimal for Lorentz modes of operation. For example, for ideal performance of the example charged particle microscope system 100, the $C_5$ aberration has to be small enough, and preferably negative, so that it can compensate for $C_7$ aberration in combination with the $C_S$ aberration and defocus.

Additionally, in prior art microscope systems it is desired that the level of excitation of the main hexapoles of current correctors 116 be very high so as to reduce the $C_C$ and thermal magnetic field noise (i.e., Johnson noise) generated within the microscope system. However, in these prior systems, such an increase in the excitation of the main hexapoles also creates a huge combination-$C_5$ aberration that inhibits performance of the microscope system. While a single transfer lens may be positioned optimally for operation in standard mode, the single transfer lens cannot be positioned to also be optimal when prior art microscope systems operate in Lorentz mode. Accordingly, in present day microscope systems, a much lower excitation of the main hexapole has to be chosen. This results in a non-ideal situation where the corrector contribution to the $C_C$ and thermal magnetic field noise is not optimally demagnified. Moreover, even in this state of reduced main hexapole excitation, a sub-optimal combination-$C_5$ aberration still exists in present day microscope systems. Because of these issues, the attainable Lorentz-STEM resolution for current single transfer lens configurations is limited.

However, example charged particle microscope system(s) 100 according to the present disclosure address these issues by incorporating an extra transfer lens between the corrector and the first transfer lens 124 (i.e., second transfer lens 126). By replacing the single lens of prior systems with two well-positioned and/or ideally optically configured transfer lenses, the example charged particle microscope system(s) 100 disclosed herein are able to be optimized in multiple modes of operation (i.e., standard mode and Lorentz mode). That is, according to the present disclosure, the position and/or the optical properties of the first transfer lens 124 and the second transfer lens 126 are optimized so that the performance of the example charged particle microscope system 100 are optimized in the normal mode of operation, while also being optimized in a Lorentz mode of operation. For example, the second transfer lens 126 allows the $C_5$, $C_S$, and defocus to be tuned to optimally balance $C_7$ aberration in a Lorentz mode of operation. In addition to limiting these higher order geometric aberrations, the second transfer lens 126 may be positioned and/or otherwise optically configured to reduce the chromatic aberration, and/or thermal magnetic field noise.

Moreover, in some embodiments the first transfer lens 124 and the second transfer lens 126 may also be positioned and/or otherwise optically configured to provide an improved performance of the example charged particle microscope system 100 in the standard mode of operation over single transfer lens configurations. For example, in a standard operating mode for the charged particle microscope systems, there is a considerable range in accelerating voltage (e.g. 30 to 300 kV). In prior systems having current single transfer lens configurations, if the that the design is optimized for a high end accelerating voltage (e.g., 300 kV) then the design is non-optimal for a low end accelerating voltage (e.g., 30 kV). However, in the example charged particle microscope system(s) 100 according to the present disclosure, the second transfer lens 126 provides an additional degree of freedom that allows the focusing column 114 to be optimized across a whole range of accelerating voltages.

FIG. 1 further illustrates the example charged particle microscope system(s) 100 as including a sample holder 128 that holds the sample 102. The example charged particle microscope system(s) 100 is also shown as including a detector 130 that is configured to detect charged particles that are pass through the sample 102 as a result of the charged particle beam 104 being incident on the sample 102. In addition, the example charged particle microscope system(s) 100 is illustrated as including astigmatism correction and scan coils 132 for causing the charged particle beam 104 to scan the surface of the sample 102. For example, by operating scan coils 132, the direction of the charged particle beam 104 may be shifted so that it strikes a different location of the sample 102. The example charged particle microscope system(s) 100 further includes one or more projection lenses 136 positioned between the sample 102 and the detector 130.

FIG. 1 further shows example charged particle microscope system(s) 100 as optionally including a computing device(s) 134. Those skilled in the art will appreciate that the computing devices 134 depicted in FIG. 1 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing devices 134 may also be connected to other devices that are not illustrated, or instead may operate as a stand-alone system. In addition, the functionality provided by the illustrated components may in some implementations be combined in fewer components or distributed in additional components. Similarly, in some implementations, the functionality of some of the illustrated components may not be provided and/or other additional functionality may be available.

The computing device(s) 134 may be a component of the example charged particle microscope system(s) 100, may be a separate device from the example charged particle microscope system(s) 100 which is in communication with the example charged particle microscope system(s) 100 via a network communication interface, or a combination thereof. For example, an example charged particle microscope system(s) 100 may include a first computing device 134 that is a component portion of the example charged particle microscope system(s) 100, and which acts as a controller that drives the operation of the example charged particle microscope system(s) 100 (e.g., adjust the scanning location on the sample 102 by operating the scan coils 132, etc.). In such an embodiment the example charged particle microscope system(s) 100 may also include a second computing device 134 that is desktop computer separate from the example charged particle microscope system(s) 100, and which is executable to process data received from the detector 134 to generate images of the sample 102 and/or perform other types of analysis. The computing devices 134 may receive user selections via a keyboard, mouse, touchpad, touchscreen, etc.

The computing devices 134 include one or more processors configured to execute instructions, applications, or programs stored in a memory(s) accessible to the one or more processors. In some examples, the one or more processors may include hardware processors that include, without limitation, a hardware central processing unit (CPU), a graphics processing unit (GPU), and so on. While in many instances the techniques are described herein as being performed by the one or more processors, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories accessible to the one or more processors are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory and other storage devices for purposes of memory management and data integrity. Alternatively, in other implementations, some or all of the software components may execute in memory on another device and communicate with the computing devices 134. Some or all of the system components or data structures may also be stored (e.g., as instructions or structured data) on a non-transitory, computer accessible medium or a portable article to be read by an appropriate drive, various examples of which are described above. In some implementations, instructions stored on a computer-accessible medium separate from the computing devices 134 may be transmitted to the computing devices 134 via transmission media or signals such as electrical, electromagnetic, or digital signals, conveyed via a communication medium such as a wireless link. Various implementations may further include receiving, sending or storing instructions and/or data implemented in accordance with the foregoing description upon a computer-accessible medium.

Figure 2:
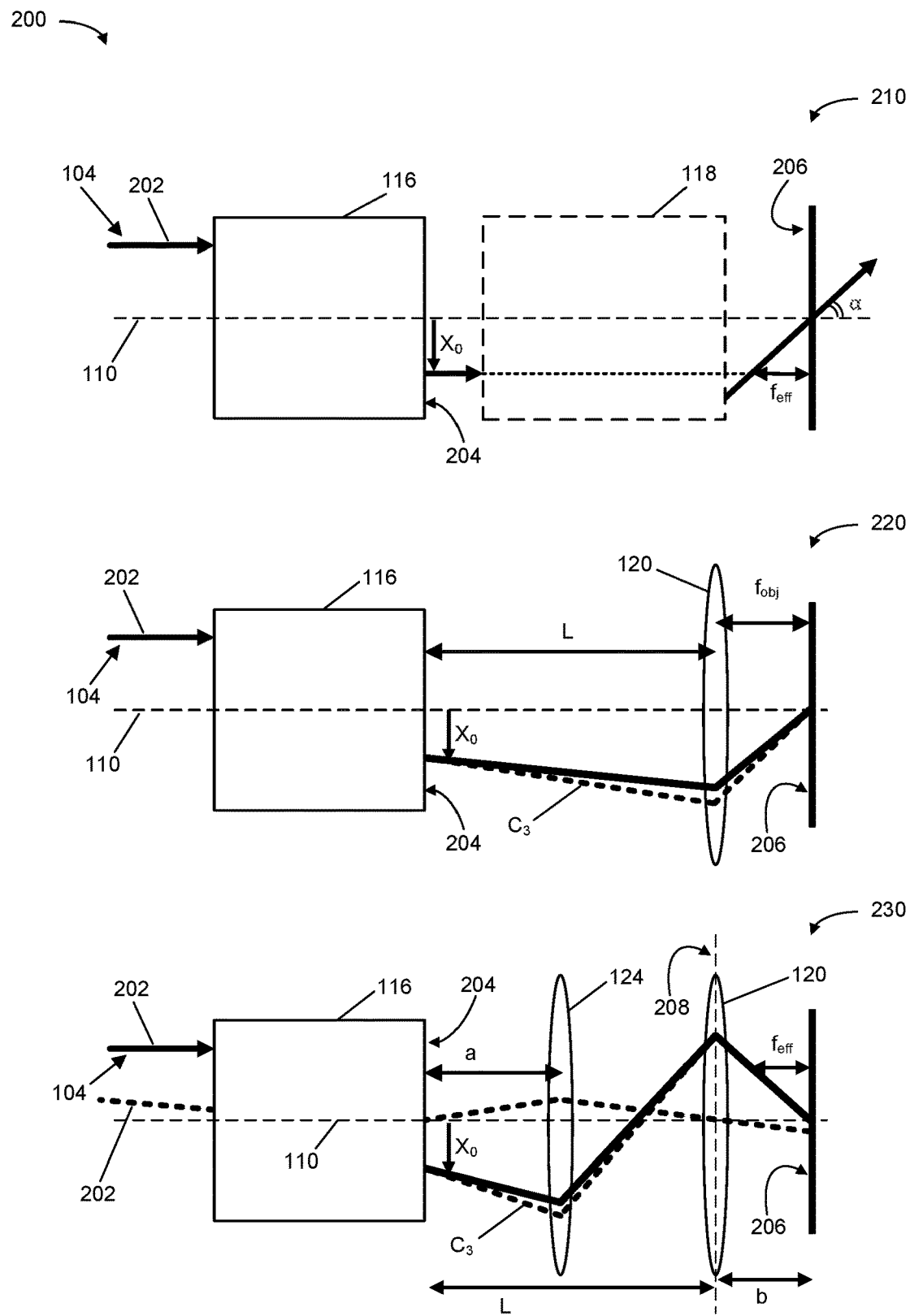
FIG. 2 is a collection of diagrams that illustrate the optical behavior of corrector transfer optics of charged particle systems having a corrector and an arrangement of one or more lenses.

FIG. 2 is a collection of diagrams 200 that illustrate the optical behavior of corrector transfer optics of charged particle systems having a corrector and an arrangement of one or more lenses. Specifically, diagrams 210, 220, and 230 illustrate the optical behavior for considering aberrations present in such charged particle systems.

Diagram 210 shows a general scheme for a corrected STEM that clarifies the meaning of the effective focal distance ($f_{eff}$) used below in equation (1). Each of diagrams 210, 220, and 230 show axial rays of the charged particle beam 104 in the xz plane, where the z axis corresponds to the emissions axis 110 of the example charged particle microscope system(s) 100.

When computing the performance of the example charged particle microscope system(s) 100, we can assume that the axial ray 202 of the charged particle beam 104 is parallel to the emission axis 110 when it leaves the corrector 116, and that the corrector exit plane 204 corresponds to the plane where position aberrations are zero or minimal. For example, where the corrector 116 is a hexapole corrector the exit plane is a virtual plane at the center of the last main hexapole. The effective focal distance ($f_{eff}$) can be defined as:

$$x_0 = (x_s')f_{eff} \quad (1)$$

where $x_s' = \partial x / \partial z \approx a$ (a is always much smaller than 1) in the sample plane 206, and $x_0$ is the x-coordinate in the corrector exit plane 204. As there is no net acceleration or deceleration between the corrector 116 and the sample 102, the transfer of first order rays from corrector exit plane 204 to the sample plane 206 is governed by the follow transfer matrix with a determinant=1:

$$\begin{pmatrix} x_s \\ x_s' \end{pmatrix} = \begin{pmatrix} 0 & -f_{eff} \\ f_{eff}^{-1} & T_{22} \end{pmatrix} \begin{pmatrix} x_0 \\ x_0' \end{pmatrix} \quad (2)$$

Diagram 220 shows an optical scheme for a corrected STEM with an objective lens 120 without a transfer lens. Using a simplistic thin lens model, the effect of a lens is given by equation (3), in which f is the focal distance, and $C_s$ and $C_5$ are spherical aberration coefficients of order 3 and 5, respectively.

$$\begin{pmatrix} x_{out} \\ x_{out}' \end{pmatrix} = \begin{pmatrix} 1 & 0 \\ -f^{-1} & 1 \end{pmatrix} \begin{pmatrix} x_{in} \\ x_{in}' \end{pmatrix} + \begin{pmatrix} 0 \\ -C_s f^{-4} x_{in}^3 - C_5 f^{-6} x_{in}^5 \end{pmatrix} \quad (3)$$

In equation (3), the subscript "in" refers to incoming electron(s), and the subscript "out" refers to exit electron(s), both in the plane of the thin lens of course. At the start of the corrector exit plane 204, when the corrector strength ($K_3$) is greater than 0, then:

$$\begin{pmatrix} x \\ x' \end{pmatrix} = \begin{pmatrix} x_0 \\ K_3 x_0^3 \end{pmatrix} \quad (4)$$

The drift space between the corrector and the objective lens 120 is then represented by:

$$\begin{pmatrix} x_1 \\ x_1' \end{pmatrix} = \begin{pmatrix} x_0 + LK_3 x_0^3 \\ K_3 x_0^3 \end{pmatrix} \quad (5)$$

Equation (5) shows that this drift space between the corrector and the objective lens 120 results in a third order position aberration, which gives rise to a fifth order combination aberration via the relationship:

$$(x_0 + LK_3 x_0^3)^3 = x_0^3 + 3LK_3 x_0^5 + \ldots \quad (6)$$

This causes the objective lens 120 action, and subsequent drift to the sample plane 206 to be:

$$\begin{pmatrix} x_s \\ x_s' \end{pmatrix} = \quad (7)$$

$$\begin{pmatrix} 1 & f_{obj} \\ 0 & 1 \end{pmatrix} \begin{pmatrix} 1 & 0 \\ -f_{obj}^{-1} & 1 \end{pmatrix} \begin{pmatrix} x_1 \\ x_1' \end{pmatrix} + \begin{pmatrix} 1 & f_{obj} \\ 0 & 1 \end{pmatrix} \begin{pmatrix} 0 \\ -C_s f^{-4} x_1^3 - C_5 f^{-6} x_1^5 \end{pmatrix}$$

And hence:

$$x_s = f_{obj} x_1' - C_s f_{obj}^{-3} x_1'^3 - C_5 f_{obj}^{-5} x_1^5 = f_{obj} K_3 x_0^3 - C_s f_{obj}^{-3}$$
$$(x_0 + LK_3 x_0^3)^3 - C_5 f_{obj}^{-5} x_0^5 + \ldots \quad (8)$$

In terms of the angle $\alpha = -x_0 / f_{obj}$, this becomes:

$$x_s = (C_s - K_3 f_{obj}^4) \alpha^3 + (C_5 - 3LC_s K_3 f_{obj}^2) \alpha^5 \quad (9)$$

Therefore, $C_S$ aberration correction is achieved if the corrector strength obeys $K_3 = C_s f_{obj}^{-4}$, which results in $x_s = C_{5,total} \alpha^5$, with a total fifth order aberration coefficient of:

$$C_{5,total} = C_5 + 3L \left( \frac{C_s}{f_{obj}} \right)^2 \quad (10)$$

Diagram 230 shows an optical scheme for a corrected STEM with an objective lens 120 and a transfer lens 124. Usually, the aberrations of transfer lens 124 plus an objective lens 120 are dominated by the objective lens contribution. For the simplest case where the transfer lens aberrations are ignored and $C_5$ is equal to zero for the objective lens 120, then the total $C_5$ is zero for the system if the corrector exit plane is imaged onto the objective lens, as depicted in diagram 230. The transfer optics then simultaneously ensures that off-axial isotropic coma is small, which is relevant for an imaging corrector in TEM mode. In practice there is a small difference between transfer lens settings for zero isotropic coma and optimal C5, so one has to decide which one is more important. The difference (and hence the dilemma) can be made smaller by allowing for non-parallel illumination of the sample. In Lorentz-TEM mode, off-axial coma is usually small enough for the case that C5 is zero or optimally counterbalancing C7.

In such an optical configuration, there is no position aberration in the objective lens plane 208, and hence no combination $C_5$. However, for a different excitation of the transfer lens, we have again a position aberration in the lens:

$$x_1 = x_0 + d_z K_3 x_0^3 \quad (11)$$

where the distance $d_z$ can have either sign, and hence a corresponding combination $C_5$ can also have either sign. For example, where the system in diagram 230 includes a weaker transfer lens 124, then the weaker transfer 124 lens can generate a negative combination $C_5$, which can correct for a positive $C_5$ of the objective lens 120 (within certain limits).

Suppose again that the transfer lens 124 (with focal distance $f_t$) exactly images the corrector exit plane 204 onto the objective lens 120. This implies $f_t = a - a^2/L$, and:

$$f_{eff} = \frac{a}{L-a} \cdot b \quad (12)$$

In practice, for a given objective lens 120, b and L are more or less given, and the optical designer has a single degree of freedom to optimize the distance a. This allows the optical configuration to be optimized for a single objective lens 120. However, such a configuration would no longer be optimized if the objective lens 120 is turned off, and another lens acts as a functional objective lens (such as when the example charged particle microscope system(s) 100 operates in a Lorentz mode of operation).

It follows that in order for an optical system to use maximum corrector 116 strength $K_{3,max}$ for both a standard operating mode and a Lorentz mode, then:

$$K_{3,max} = C_s f_{eff}^{-4} = C_{sL} f_{eff,L}^{-4} \quad (13)$$

where the subscript L refers to Lorentz mode. Further, using typical ratios, the ratio between the optimal distances a for a Lorentz operating mode and a standard operating mode can be determined based on the relationship:

$$\left(\frac{a_L}{L - a_L}\right) = \left(\frac{a}{L-a}\right) \cdot \frac{b}{b_L}\left(\frac{C_{sL}}{C_s}\right)^{\frac{1}{4}} \approx X\left(\frac{a}{L-a}\right) \quad (14)$$

where X is a value between 0.4 and 0.6. Thus, the optimal distance $a_L$ for the transfer lens 124 in a Lorentz mode of operation is significantly smaller than the optimal distance in a standard mode of operation. In some embodiments the $a_L$ for the transfer lens 124 is smaller than the $a_L$ in equation (14). In such embodiments both the first transfer lens and the second transfer lens are excited in Lorentz mode. For example, in a preferred embodiment $a_L$ may be selected so that there is a cross-over of the charged particle beam 104 in the first transfer lens 124 such that there is a decoupling between the tuning of defocus, $C_s$, and $C_5$.

A similar calculation can be made for the case of a Cs-corrector with a non-parallel beam (e.g., at the side facing the specimen). For example a STEM Cs-corrector with a beam cross-over in the exit plane, in which there are no third order slope aberrations—only third order position aberrations which correspond to a negative Cs. This finally results in:

$$L - a_L = (L-a)\frac{b_L}{b}\left(\frac{C_s}{C_{sL}}\right)^{\frac{1}{4}} \approx \frac{L-a}{X}$$

in which again X is a value between 0.4 and 0.6, typically. Hence also in this case the optimal distance $a_L$ for the transfer lens 124 in a Lorentz mode of operation is significantly smaller than the optimal distance in a standard mode of operation.

As discussed above in the remarks regarding FIG. 1, the example charged particle microscope system(s) 100 disclosed herein overcome this difference in optimal distances by incorporating an extra transfer lens 126 between the corrector 116 and the transfer lens 124. The inclusion of this transfer lens 126 provides optical designers with an additional degree of freedom with which to optimize the system, which in turn allows them to optimize the performance (i.e., reduce and/or correct aberrations) for the system in both a standard operating mode and a Lorentz operating mode. Such optimization was not possible in prior single transfer lens configurations.

Figure 3:
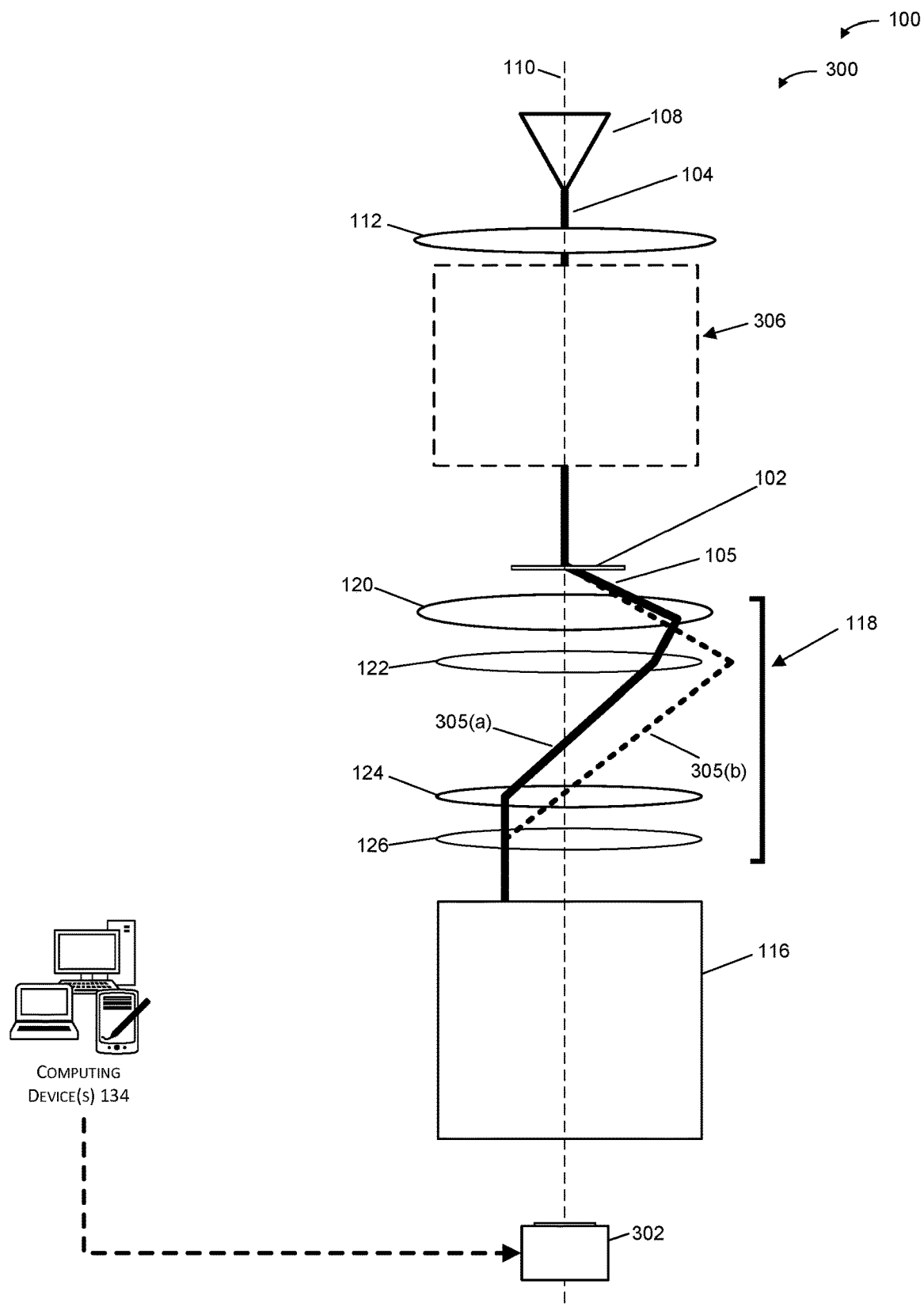
FIG. 3 illustrates an example charged particle microscope system as being a TEM system that is capable of operating in a standard mode of operation and a Lorentz mode of operation.

FIG. 3 shows the example charged particle microscope system(s) 100 as being a TEM system 300 that is capable of operating in a standard mode of operation and a Lorentz mode of operation.

The TEM system 300 is configured to irradiate the sample 102 with a charged particle beam 104 that is emitted by charged particle source 108. As illustrated in FIG. 3, the path of the charged particle beam 104 changes depending on the mode of operation of the example charged particle microscope system(s) 100. For example, FIG. 3 shows the charged particle beam 104 following beam path 304(a) when the TEM system 300 is operating in standard operating mode, and beam path 304(b) when the TEM system 300 is operating in a Lorentz mode of operation. The accelerator lens 112 accelerates/decelerates, focuses, and/or directs the charged particle beam 104 towards the sample 102. In some embodiments, the TEM system 300 includes a focusing column 306 that directs the charged particle beam 104 so that it is incident on sample 102.

FIG. 3 further illustrates the TEM system 300 as including a corrector 116 that is positioned in the path of the axial electrons 105 scattered by the sample 102. The corrector 116 is an optical component for correcting axial (and in some cases off-axial) aberrations of the charged particle beam 104. In FIG. 3, the TEM system 300 is further illustrated as including the arrangement of a plurality of lenses 118 which include an objective lens 120, a Lorentz lens 122, a first transfer lens 124, and a second transfer lens 126. In some embodiments, when the example charged particle microscope system 100 is operating in a Lorentz mode the objective lens 120 is turned off. In such embodiments, the Lorentz lens 122 acts like an objective lens. The Lorentz lens 122 is an optical lens that renders a divergent portion of the charged particle beam 104 from the objective lens 120 so that it is a converging beam and/or more convergent beam. For example, FIG. 3 illustrates the Lorentz lens 122 as rendering the portion of charged particle beam 104 so that it is (a) a more convergent beam when the TEM system 300 operated in a standard mode of operation, and (b) a convergent beam when the TEM system 300 operates in a Lorentz mode.

As illustrated in FIG. 3, the path of the axial electrons 105 changes depending on the mode of operation of the example charged particle microscope system(s) 300. For example, FIG. 3 shows the axial electrons 105 following path 105(*a*) when the example charged particle microscope system(s) 300 is operating in standard operating mode, and path 105(*b*) when the example charged particle microscope system(s) 300 is operating in a Lorentz mode of operation.

FIG. 3 further illustrates the arrangement of a plurality of lenses 118 as including a first transfer lens 124 and a second transfer lens 126. Traditionally, similar microscope systems only contained a single transfer lens that was positioned and/or otherwise had its optical characteristics configured to optimize the performance of the microscope system during a single mode of operation. Additionally, such single transfer lens arrangements are ill-suited for Lorentz microscopy with a non-immersion objective lens.

FIG. 3 further illustrates the TEM system 300 as including a camera 302 that is configured to receive the charge particle beam 104 after it leaves the corrector 116. The camera 302 is configured to generate an image of and/or determine composition information of the sample 102 based upon the portion of the charged particle beam 104 it receives. FIG. 3 further shows example charged particle microscope system(s) 100 as optionally including a computing device(s) 134.

Figure 4:
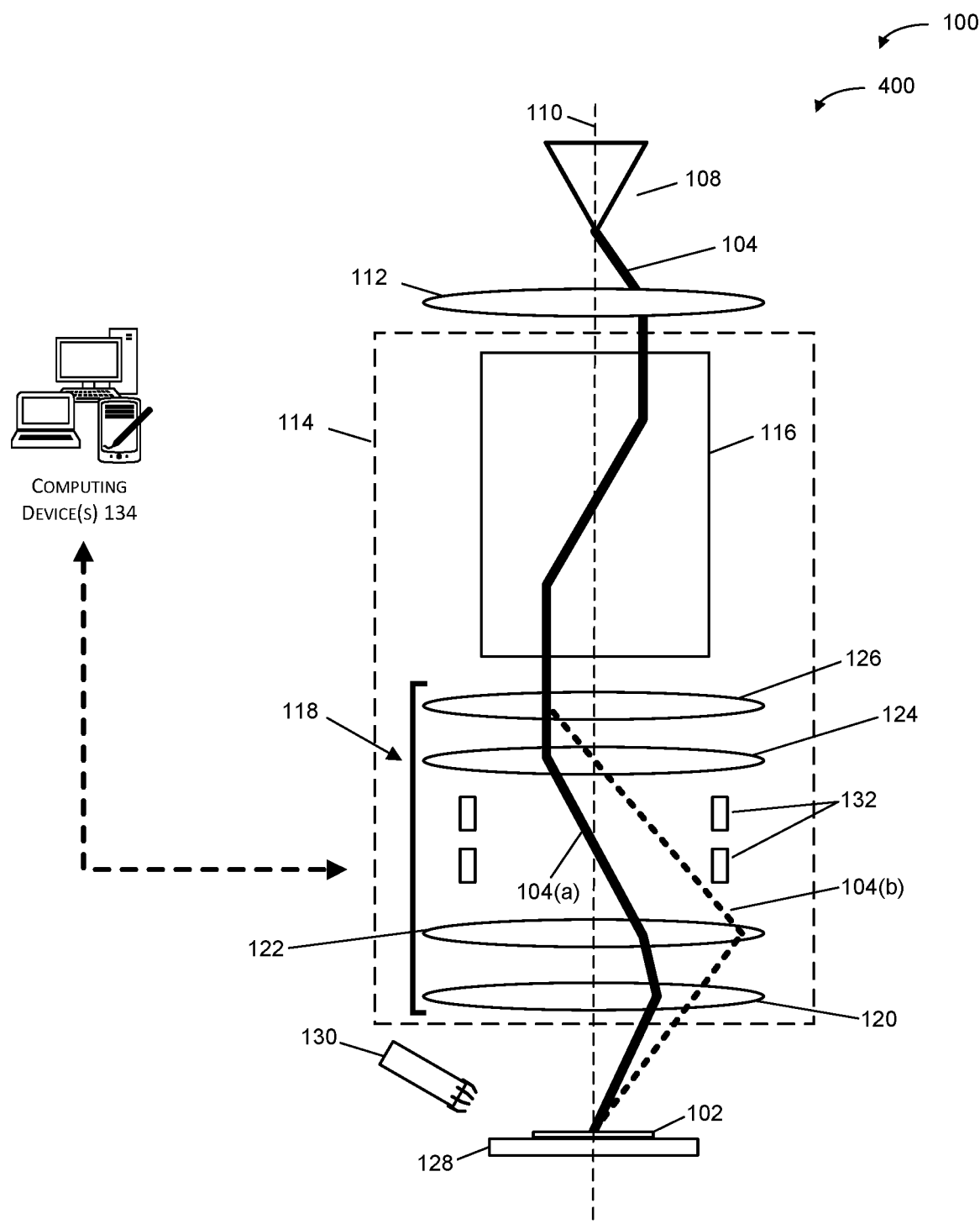
FIG. 4 depicts a sample process for inspection of, deposition on, milling of, and/or extraction of a component of a sample having an optimized performance in multiple modes of operation using a charged particle microscope system.

FIG. 4 shows the example charged particle microscope system(s) 100 as being a SEM system 400 that is capable of operating in a standard mode of operation and a Lorentz mode of operation. As illustrated in FIG. 4, the path of the charged particle beam 104 changes depending on the mode of operation of the example charged particle microscope system(s) 400. For example, FIG. 4 shows the charged particle beam 104 following beam path 104(*a*) when the example charged particle microscope system(s) 100 is operating in standard operating mode, and beam path 104(*b*) when the example charged particle microscope system(s) 100 is operating in a Lorentz mode of operation.

The example charged particle microscope system(s) 400 includes a charged particle source 108 that emits the charged particle beam 104 along an emission axis 110 and towards an accelerator lens 112. The accelerator lens 112 accelerates/decelerates, focuses, and/or directs the charged particle beam 104 towards a focusing column 114. The focusing column 114 focuses the charged particle beam 104 so that it is incident on sample 102. Additionally, the focusing column 114 corrects and/or tunes aberrations (e.g., geometric aberrations, chromatic aberrations, etc.) of the charged particle beam 104. In FIG. 4, the focusing column 114 is illustrated as including a corrector 116 and an arrangement of a plurality of lenses 118. The corrector 116 is an optical component for correcting axial aberrations of the charged particle beam 104.

In FIG. 4, the focusing column 114 is further illustrated as including the arrangement of a plurality of lenses 118 which include an objective lens 120, a Lorentz lens 122, a first transfer lens 124, and a second transfer lens 126. In some embodiments, when the example charged particle microscope system 400 is operating in a Lorentz mode the objective lens 120 is turned off. In such embodiments, the Lorentz lens 122 acts like an objective lens and focuses the charged particle beam 104 onto the sample. For example, FIG. 4 illustrates the Lorentz lens 122 as rendering the divergent portion of charged particle beam 104 to (a) a less divergent beam when the example charged particle microscope system 400 operated in a standard mode of operation, and (b) a convergent beam when the example charged particle microscope system 400 operates in a Lorentz mode.

FIG. 4 further illustrates the arrangement of a plurality of lenses 118 as including a first transfer lens 124 and a second transfer lens 126. According to the present disclosure, the position and/or the optical properties of the first transfer lens 124 and the second transfer lens 126 are optimized so that the performance of the example charged particle microscope system 400 are optimized in the normal mode of operation, while also being optimized in a Lorentz mode of operation. Moreover, in some embodiments the first transfer lens 124 and the second transfer lens 126 may also be positioned and/or otherwise optically configured to provide an improved performance of the example charged particle microscope system 400 in the standard mode of operation over single transfer lens configurations.

FIG. 4 further illustrates the example charged particle microscope system(s) 400 as including a sample holder 128 that holds the sample 102. The example charged particle microscope system(s) 400 is also shown as including a detector 130 that is configured to detect charged particles that are emitted by and/or reflected by the sample 102 as a result of the charged particle beam 104 being incident on the sample 102. In addition, the example charged particle microscope system(s) 100 is illustrated as including astigmatism correction and scan coils 132 for causing the charged particle beam 104 to scan the surface of the sample 102. FIG. 4 further shows example charged particle microscope system(s) 400 as optionally including a computing device(s) 134.

Figure 5:
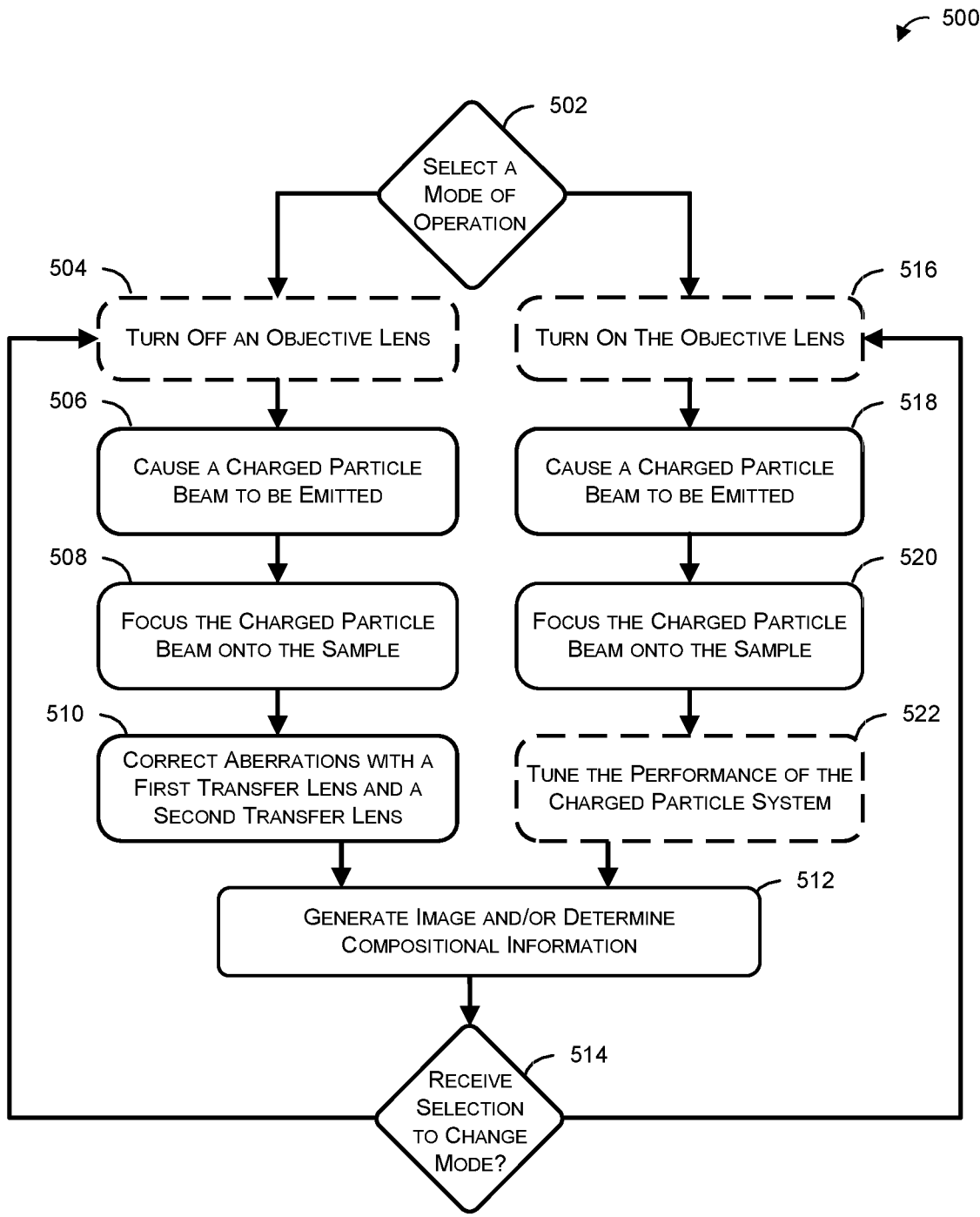
FIG. 5 is a diagram that shows the optical performance of a system having a single transfer lens arrangement operating in a Lorentz mode of operation.

FIG. 5 is a flow diagram of illustrative processes illustrated as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

FIG. 5 is a depicts a sample process 500 for inspection of, deposition on, milling of, and/or extraction of a component of a sample having an optimized performance in multiple modes of operation using a charged particle microscope system. The process 500 may be implemented in any of the example charged particle microscope system(s) 100, 300, and 400 and/or by the computing device(s) 134 described above, or in other environments and computing devices.

At 502, a mode of operation for the charged particle system is selected. For example, the charged particle system may receive an input to operate in either a standard mode of operation or a Lorentz mode of operation. A standard mode of operation corresponds to a mode of operation where a sample is irradiated with a charged particle beam for the inspection of, deposition on, milling of, and/or extraction of a component of a sample. A Lorentz mode of operation corresponds to an imaging mode in which a magnetic contrast is generated base upon deflections experienced by electrically charged particles passing through a region of magnetic induction within the sample.

If at 502 a Lorentz mode of operation is selected, the process continues at step 404, and the objective lens is optionally turned off. In embodiments where the objective lens is turned off, a Lorentz lens then acts as a functional objective lens.

At step 506, a charged particle beam is emitted by a charged particle source. Specifically, a charged particle beam is emitted by a charged particle source along an emission axis toward the sample. The charged particle source may include a thermal electron source, Schottky-emission source, field emission source, a liquid metal ion source, a plasma ion source, etc. The emission axis is a central axis that runs along the length of the charged particle system from the charged particle source and through the sample.

At 508, the charged particle beam is focused onto the sample. In some embodiments, the charged particle beam may pass through a focusing column that directs it onto the sample. In some embodiments, the focusing column may include a corrector that corrects axial aberrations of the charged particle beam (e.g., a hexapole corrector, which can be a Rose(-like), or a S-CORR corrector, or a Crewe(-like) hexapole corrector, or a quadrupole-octupole corrector, or any other type). Alternatively, where the charged particle system is a transmission microscope the corrector may be positioned downstream of the beam path from the sample.

At 510, a first transfer lens and a second transfer lens are used to tune aberrations. Specifically, the first transfer lens and a second transfer lens are used to tune the $C_5$, $C_S$, and defocus to optimally balance $C_7$ aberration while the charged particle system is in a Lorentz mode of operation. For example, a corrector in the charged particle system may tune one or more axial (an in some cases off-axial) aberrations by matching the negative $C_S$ generated by the corrector to the positive $C_S$ generated by the objective lens. In such a case, the first transfer lens and a second transfer lens may tune any contribution to $C_5$ by the corrector and the Lorentz lens to zero. In addition to limiting these higher order geometric aberrations, the second transfer lens may be positioned and/or otherwise optically configured to reduce the chromatic aberration, and/or thermal magnetic field noise. In addition to limiting these higher order geometric aberrations, in some embodiments the second transfer lens may be positioned and/or otherwise optically configured to allow the main hexapoles to be set at higher level of excitation (e.g., maximal excitation), thus reducing the chromatic aberration, and/or thermal magnetic field noise. The position and/or optical configuration of the first and second transfer lens are such that the performance of the charged particle system is optimized in both the standard mode of operation and the Lorentz mode of operation.

At 512, an image is generated and/or compositional information about the sample is determined. For example, a camera or other type of detector may be used to receive a portion of the charged particle beam that is transmitted through the sample and/or charged particles reflected/emitted by the sample, and a computing device associated with the charged particle system may generate an image based on the data from the camera and/or sensor.

At 514, the charged particle system receives an input to change its mode of operation. If the charged particle system was operating in a standard mode of operation, then the process continues at step 504, and the charged particle system operates in a Lorentz mode of operation. Alternatively, if the charged particle system was operating in a Lorentz mode of operation, then the process continues at step 516, and the charged particle system operates in a standard mode of operation. At step 516, and the objective lens is optionally turned on.

At step 518, a charged particle beam is emitted by a charged particle source. Specifically, a charged particle beam is emitted by a charged particle source along an emission axis toward the sample.

At 520, the charged particle beam is focused onto the sample. In some embodiments, the charged particle beam may pass through a focusing column that directs it onto the sample. In some embodiments, the focusing column may include a corrector that corrects axial aberrations of the charged particle beam. Alternatively, where the charged particle system is a transmission microscope the corrector may be positioned downstream of the beam path from the sample.

At 522, the pair of transfer lenses are optionally used to tune the performance of the charged particle system. In some embodiments, the first transfer lens and the second transfer lens may be positioned and/or otherwise optically configured to provide an improved performance of the charged particle system. For example, in a standard operating mode for the charged particle microscope systems, there is a considerable range in accelerating voltage (e.g. 30 to 300 kV). In prior systems having current single transfer lens configurations, if the that the design is optimized for a high end accelerating voltage (e.g., 300 kV) then the design is non-optimal for a low end accelerating voltage (e.g., 30 kV). However, in the example charged particle system according to the present disclosure, the second transfer lens provides an additional degree of freedom that allows the charged particle system to be optimized across a whole range of accelerating voltages. The process then continues to step 512, where an image is generated and/or compositional information about the sample is determined.

Figure 6:
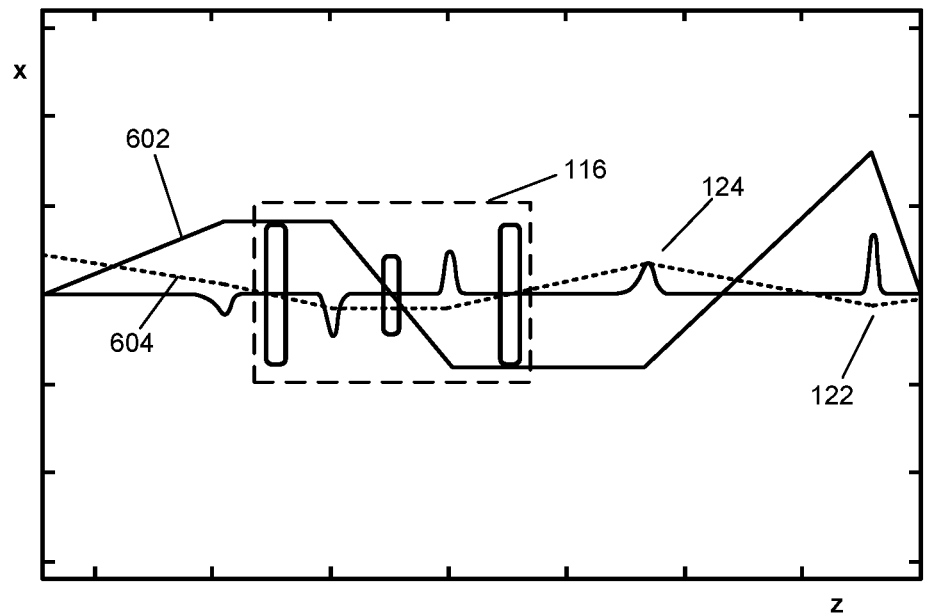
FIG. 6 is a diagram that shows the optical performance of a system having a single transfer lens arrangement operating in a Lorentz mode of operation.
Figure 7:
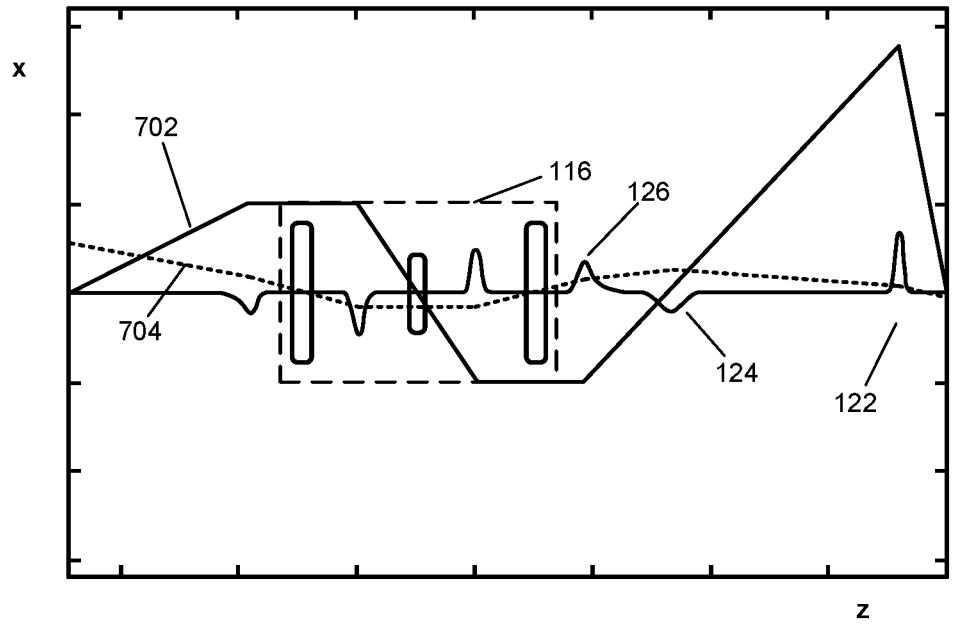
FIG. 7 is a diagram that shows the optical performance of a system having a multiple transfer lens arrangement operating in a Lorentz mode of operation.

FIGS. 6 and 7 are illustrations of the optical performance of a system having a single transfer lens arrangement, and a system having a multiple transfer lens arrangement, respectively. FIG. 6 illustrates the optical performance of a system having a single transfer lens arrangement operating in a Lorentz mode of operation, where the position of this transfer lens is optimal for the normal mode of operation. FIG. 6 shows both a beam path of an axial ray 602 of charged particle beam 102, and a beam path of an off-axial ray 604 of charged particle beam 102 which has cross-overs at the centers of the main hexapoles, where the corrector 116 is an S-CORR that is operating at a particular accelerating voltage). FIG. 7 illustrates the optical performance of a system having a multiple transfer lens arrangement operating in a Lorentz mode of operation. FIG. 7 shows both a beam path of an axial ray 702 of charged particle beam 102, and a beam path of an off-axial ray 704 of charged particle beam 102 where the corrector 116 is operating at a particular accelerating voltage. In FIG. 7, the main hexapoles of corrector 116 are excited such that a very small excitation of the central hexapole is needed to yield $A_5=0$. The first transfer lens 124 and second transfer lens 126 are optimally positioned so that $C_5$, $C_S$ and defocus are tuned to optimally balance C7. Additionally, the 3-fold aberrations $A_2$ and $D_4$ are tuned to optimally balance $D_6$.

Examples of inventive subject matter according to the present disclosure are described in the following enumerated paragraphs.

A1. A charged particle microscope configured to operate in a standard operating mode when in a first configuration, and a Lorentz operating mode when in a second configuration, the charged particle microscope comprising:

a charged particle source configured to emit a charged particle beam toward a sample;

a sample holder configured to hold the sample;

a corrector for correcting axial aberrations;

a Lorentz lens located between the corrector and the sample holder;

an objective lens between the Lorentz lens and the sample holder;

a first transfer lens positioned between the corrector and the Lorentz lens;

a second transfer lens positioned between the corrector and the first transfer lens; and wherein the charged particle microscope is configured to switch between the first configuration in which it operates in the standard operating mode, and the second configuration in which it operates in the Lorentz mode.

A1.1. The charged particle microscope of paragraph A1, wherein the second transfer lens is configured to:

cause a beam cross-over of an axial ray of the charged particle beam in the first transfer lens to be at or proximate to a center of the first transfer lens when the charged particle microscope is operating in the Lorentz operating mode; and assist the first transfer lens in imaging the corrector exit plane onto a plane close to the objective lens to minimize combination aberration $C_5$ when the charged particle microscope is operating in the standard operating mode.

A1.1.1. The charged particle microscope of paragraph A1.1, wherein the first transfer lens and a second transfer lens are positioned and/or otherwise configured to tune the $C_5$, $C_S$, and defocus to optimally balance $C_7$ aberration within the charged particle microscope while the charged particle system is in a Lorentz mode of operation.

A1.1.2. The charged particle microscope of paragraph A1.1, wherein the second transfer lens is positioned and/or otherwise configured such that the effective focal distance is optimal for a desired corrector strength when the charged particle microscope is operating in the Lorentz operating mode.

A1.1.2.1. The charged particle microscope of paragraph A1.1.2, wherein the effective focal distance is optimal when the total $C_S$ for the corresponding corrector strength is zero.

A1.1.2.2. The charged particle microscope of any of paragraphs A1.1.2-A1.1.2.1, wherein the second transfer lens is positioned and/or otherwise configured such that the effective focal distance is optimal with a large and/or maximal corrector strength.

A1.1.2. The charged particle microscope of any of paragraphs A1.1-A1.1.1.1, wherein when the charged particle microscope is operating in the standard operating mode, the second lens is configured to assist the first transfer lens in imaging the corrector exit plane onto a plane at or near the objective lens.

A1.1.3. The charged particle microscope of any of paragraphs A1.1-A1.1.2, wherein when the charged particle microscope is operating in the standard operating mode, the second transfer lens is positioned and/or otherwise configured such that the effective focal distance is optimal for a range of multiple accelerating voltages of the charged particle microscope.

A2. The charged particle microscope of any of paragraphs A1-A1.1.3, wherein the second transfer lens is configured to cause the diameter of the charged particle beam in the Lorentz lens to be larger when the charged particle microscope is operating in the Lorentz operating mode than when the charged particle microscope is operating in the standard operating mode.

A3. The charged particle microscope of any of paragraphs A1-A2, wherein when the charged particle microscope is operating in the standard operating mode, the second transfer lens assist the first transfer lens in imaging to reduce and/or zero the defocus, the $C_s$, and the $C_5$.

A3.1. The charged particle microscope of paragraph A3, wherein the second transfer lens assisting the transfer lens comprises the second transfer lens assisting the first transfer lens in imaging the corrector exit plane onto a plane close to the objective lens.

A4. The charged particle microscope of any of paragraphs A1-A3.1, wherein the second transfer lens is positioned so that performance of the charged particle microscope is optimized in both the Lorentz operating mode and the standard operating mode.

A5. The charged particle microscope of any of paragraphs A1-A4, wherein when the charged particle microscope is operating in the Lorentz operating mode, the second transfer lens focuses the charged particle beam to reduce and/or tune one or more spherical aberration coefficients.

A5.1. The charged particle microscope of paragraph A5, wherein the second transfer lens focusing the charged particle beam to reduce and/or tune one or more spherical aberration coefficients further comprises one or more of the corrector, the first transfer lens, the Lorentz lens, and the objective lens working with the second transfer lens to reduce and/or tune one or more spherical aberration coefficients.

A5.2. The charged particle microscope of any of paragraphs A5-A5.1, wherein reduce and/or tune one or more spherical aberration coefficients comprises optimally tuning one or more of defocus, $C_s$, and $C_5$.

A5.3. The charged particle microscope of any of paragraphs A5-A5.2, wherein the charged particle microscope is operating in the Lorentz operating mode, the second transfer lens focuses the charged particle beam to cause a reduction of and/or a tuning of a fifth order spherical aberration coefficient.

A5.4. The charged particle microscope of any of paragraphs A5-A5.3, wherein reducing and/or tuning the one or more spherical aberration coefficients comprises tuning the position of an off-axial ray in the Lorentz lens to compensate for the one or more spherical aberration coefficients.

A5.4.1. The charged particle microscope of paragraph A5.4, wherein reducing and/or tuning the one or more spherical aberration coefficients comprises causing the position of the off-axial ray in the Lorentz lens to pass through or close to the center of the Lorentz lens.

A5.4. The charged particle microscope of any of paragraphs A5-A5.3.2, wherein the objective lens is turned off in the Lorentz mode and the Lorentz lens acts as a functional objective lens.

A6. The charged particle microscope of any of paragraphs A1-A5.4, wherein the corrector is a hexapole corrector, Rose corrector, Rose-like corrector, S-CORR corrector, Crewe corrector, Crewe-like corrector, and a hexapole corrector, and a quadrupole-octupole, corrector.

A7. The charged particle microscope of any of paragraphs A1-A6, wherein the charged particle source comprises a Schottky FEG or a cold FEG.

A8. The charged particle microscope of any of paragraphs A1-A7, further comprising one or both of a monochromator and a simple $C_c$ corrector.

A8.1. The charged particle microscope of paragraph A8, wherein the charged particle microscope comprises a Split Wien filter with a nano-slit in midplane that acts as both the monochromator and the simple Cc-corrector.

A9. The charged particle microscope of any of paragraphs A1-A8.1, wherein the charged particle microscope is a transmission electron microscope.

A9.1. The charged particle microscope of paragraph A9, wherein the sample holder is positioned between the charged particle source and the corrector.

A10. The charged particle microscope of any of paragraphs A1-A8.1, wherein the charged particle microscope is a scanning electron microscope.

A10.1. The charged particle microscope of paragraph A10, wherein the corrector is positioned between the charged particle source and the sample holder.

B1. A method for operating a charged particle microscope configured to operate in a standard operating mode when in a first configuration, and a Lorentz operating mode when in a second configuration, the method comprising:
cause a charged particle beam to be emitted toward a sample by a charged particle source;
correct, via a corrector, for correcting axial aberrations;
when the charged particle microscope is operating in the Lorentz operating mode, using a second transfer lens to cause a beam cross-over of an axial ray of the charged particle beam in a first transfer lens to be at or proximate to a center of the first transfer lens; and
when the charged particle microscope is operating in the standard operating mode, using a second transfer lens to assist the first transfer lens in imaging the corrector exit plane onto a plane close to the objective lens to minimize combination aberration $C_5$.

B1.1. The method of paragraph B1, wherein: focusing the charged particle beam when the charged particle microscope is operating in the Lorentz operating mode comprises using the second transfer lens to cause a cross-over of an axial beam of the charged particle beam in the first transfer lens to be at or proximate to a center of the first transfer lens; and using a second transfer lens to assist the first transfer lens when the charged particle microscope is operating in the standard operating mode comprises the second transfer lens assisting the first transfer lens in imaging the corrector exit plane onto a plane close to the objective lens.

B2. The method of any of paragraphs B1-B1.1, further comprising switching between the Lorentz operating mode and the standard operating mode.

B2.1. The method of paragraph B2, wherein the charged particle microscope comprises a Lorentz lens and an objective lens, and wherein the objective lens is turned off and the Lorentz lens acts as a functional objective lens when the charged particle microscope operates in the Lorentz operating mode.

B2.1.1. The method of paragraph B2.1, wherein when the charged particle microscope is operating in the Lorentz operating mode the second transfer lens is configured to cause a/the position of an axial ray of the charged particle beam in a Lorentz lens to be farther from the center of the Lorentz lens than when the charged particle microscope is operating in the standard operating mode.

B2.1.2. The method of any of paragraphs B2.1-B2.1.1, wherein focusing the charged particle beam with the second transfer lens such that the position of the charged particle beam in the first transfer lens reduces and/or tunes a fifth order spherical aberration coefficient comprises causing the position of an off-axial ray in the Lorentz lens to not pass through the center of the Lorentz lens.

B3. The method of any of paragraphs B1-B2.1.2, wherein the second transfer lens is positioned so that performance of the charged particle microscope is optimized in both the Lorentz operating mode and the standard operating mode.

C1. Use of the charged particle microscope of any of paragraphs A1-A10 to perform the method of any of paragraphs B1-B3.

D1. A computer readable media storing non-transitory computer readable instructions that, when executed by one or more processors, cause the charged particle microscope of any of paragraphs A1-A10 to perform the method of any of paragraphs B1-B3.

What is claimed is:

1. A charged particle microscope (100) configured to operate in a normal operating mode when in a first configuration, and a Lorentz operating mode when in a second configuration, the charged particle microscope comprising:
a charged particle source (110) configured to emit a charged particle beam (104) toward a sample (102);
a sample holder (128) configured to hold the sample (102);
a corrector (116) for correcting axial aberrations;
a Lorentz lens (122) located between the corrector (116) and the sample holder (128);
an objective lens (120) between the Lorentz lens (122) and the sample holder (128); and
configured such that the charged particle microscope further includes:
a first transfer lens (124) positioned between the corrector (116) and the Lorentz lens (122);
a second transfer lens (126) positioned between the corrector (116) and the first transfer lens (124); and
wherein the charged particle microscope is configured to switch between the first configuration in which it operates in the standard operating mode, and the second configuration in which it operates in the Lorentz mode.

2. The charged particle microscope of claim 1, wherein the second transfer lens (126) is configured to cause a cross-over of an axial beam of the charged particle beam in the first transfer lens (124) to be at or proximate to a center of the first transfer lens when the charged particle microscope is operating in the Lorentz operating mode.

3. The charged particle microscope of claim 1, wherein the second transfer lens is configured to assist the first transfer lens in imaging the corrector exit plane to minimize combination aberration $C_5$ when the charged particle microscope is operating in the standard operating mode.

4. The charged particle microscope of claim 3, wherein the second transfer lens (126) assisting the first transfer lens (124) comprises the second transfer lens assisting the first transfer lens in imaging the corrector exit plane onto a plane close to the objective lens.

5. The charged particle microscope of claim 1, wherein the first transfer lens and a second transfer lens are positioned and/or otherwise configured to tune the $C_5$, Cs, and defocus to optimally balance $C_7$ aberration within the charged particle microscope while the charged particle system is in a Lorentz mode of operation.

6. The charged particle microscope of claim 1, wherein the second transfer lens is positioned and/or otherwise configured such that the effective focal distance is optimal for a desired corrector strength when the charged particle microscope is operating in the Lorentz operating mode.

7. The charged particle microscope of claim 1, wherein when the charged particle microscope is operating in the standard operating mode, the second transfer lens is positioned and/or otherwise configured such that the effective focal distance is optimal for a range of multiple accelerating voltages of the charged particle microscope.

8. The charged particle microscope of claim 1, wherein the second transfer lens (126) is configured to cause the diameter of the charged particle beam in the Lorentz lens to be larger when the charged particle microscope is operating in the Lorentz operating mode than when the charged particle microscope is operating in the standard operating mode.

9. The charged particle microscope of claim 1, wherein the second transfer lens (126) is positioned so that performance of the charged particle microscope is optimized in both the Lorentz operating mode and the standard operating mode.

10. The charged particle microscope of claim 1, wherein when the charged particle microscope is operating in the Lorentz operating mode, the second transfer lens focuses the charged particle beam to reduce and/or tune one or more spherical aberration coefficients.

11. The charged particle microscope of claim 10, wherein the charged particle microscope is operating in the Lorentz operating mode, the second transfer lens (126) focuses the charged particle beam to cause a reduction of and/or a tuning of a fifth order spherical aberration coefficient.

12. The charged particle microscope of claim 10, wherein the objective lens is turned off in the Lorentz mode and the Lorentz lens acts as a functional objective lens.

13. The charged particle microscope of claim 1, wherein the charged particle microscope is a transmission electron microscope, and the sample holder is positioned between the charged particle source and the second transfer lens.

14. The charged particle microscope of claim 1, wherein the charged particle microscope is a scanning electron microscope, and the second transfer lens is positioned between the charged particle source and the sample holder.

15. Use of the charged particle microscope of claim 1 to inspect the sample in at least one of a standard operating mode and a Lorentz operating mode.

* * * * *